United States Patent
Bordow

(10) Patent No.: US 9,589,377 B1
(45) Date of Patent: Mar. 7, 2017

(54) REAL-TIME GAP FREE TIME DOMAIN DENSITY HISTOGRAM DISPLAY WITH ARBITRARY SAMPLE RATE

(71) Applicant: Keysight Technologies, Inc., Minneapolis, MN (US)

(72) Inventor: Robin A. Bordow, Petaluma, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 610 days.

(21) Appl. No.: 13/974,531

(22) Filed: Aug. 23, 2013

(51) Int. Cl.
*G06T 11/20* (2006.01)

(52) U.S. Cl.
CPC .................................. *G06T 11/206* (2013.01)

(58) Field of Classification Search
CPC ............................. G06T 11/206; G06F 19/00
See application file for complete search history.

(56) References Cited

U.S. PATENT DOCUMENTS

| | | | | |
|---|---|---|---|---|
| 4,814,829 A * | 3/1989 | Kosugi | ................. | G03F 9/7069 355/43 |
| 5,587,917 A * | 12/1996 | Elms | .................. | G01R 21/1331 702/66 |
| 7,224,752 B2 * | 5/2007 | Sugar | ................... | H04W 16/14 375/224 |
| 2006/0025947 A1 * | 2/2006 | Earls | ...................... | G01R 23/16 702/76 |
| 2013/0158923 A1 * | 6/2013 | Stanton | .................. | G01R 23/18 702/76 |

OTHER PUBLICATIONS

Co-pending U.S. Appl. No. 13/745,008, filed Jan. 18, 2013.

* cited by examiner

*Primary Examiner* — Jeffrey A Brier

(57) ABSTRACT

A real-time spectrum analyzer for measuring time domain data of an input signal includes an ADC, a resampler and a density histogram memory unit. The ADC has a first sample rate and is configured to acquire and digitize the input signal at the first sample rate to provide first samples. The resampler has a second sample rate and is configured to acquire the first samples at the second sample rate to provide second samples grouped in sample sets, where the second sample rate is selected so that each sample set includes an integer number of second samples per an integer number of periods at a frequency of interest of the input signal. The density histogram memory unit is configured to store at least a portion of the second samples output by the resampler for generating a continuous real-time gap-free density histogram corresponding to the time domain data.

20 Claims, 12 Drawing Sheets freq = 2.5kHz, samp rate = 10.2525 MHz, 5* 821mapped points, 5 per address

REAL-TIME GAP FREE TIME DOMAIN DENSITY HISTOGRAM DISPLAY WITH ARBITRARY SAMPLE RATE

BACKGROUND

Visual graphic display of conventional time domain analyses generally take one of two forms. The first is an oscilloscope, which may receive a time domain input signal and display corresponding time domain spectra. However, the oscilloscope does not provide a real-time, gap free representation. Rather, data that occurs after the end of an acquisition, initiated in response to an initial trigger, and before the next trigger is lost. Therefore, although oscilloscopes may be able to provide a density histogram display, the display is not gap free. Also, oscilloscopes typically lack an arbitrary sample rate that a digitizer would need to make such a gap-free feature practical to use.

The second is a real-time spectrum analyzer (RTSA), which generally receives a time domain input signal and displays corresponding frequency domain spectra, where each frequency domain spectrum represents a corresponding time interval. The spectra may be obtained by performing fast Fourier transforms (FFTs) on digital time domain data representing the time domain input signal. A conventional RTSA may also provide a power versus time (PvT) display, which is real-time and gap free. However, the PvT display aggregates multiple sequential time domain samples into PvT display points. Therefore the ability to see each individual time domain sample is lost, and the effective time resolution of the PvT display is degraded. Conventional PvT displays that use density histograms are available, but only in the context of batch mode, post processing operations that are not real-time and not gap free. An RTSA has been produced capable of providing a continuous gap free time domain histogram display, but because it lacks the ability to sample at an arbitrary sample rate, it cannot keep a stable image of an arbitrary frequency signal on the display. Rather, it must either use level triggering which means gaps are introduced, or provide an unstable display.

In addition, time domain triggering in conventional oscilloscopes and RTSAs generally is level based, where the user specifies the level (with or without hysteresis). When the signal transitions through the specified level, a trigger is produced. The trigger may be used for a variety of purposes, such as causing measurement data to be stored to memory and/or displayed on a display unit. However, when a feature of interest of the input signal is surrounded by other features that also transition through the specified level, there is no way to trigger only on the feature of interest. For example, conventional frequency mask triggering techniques permit triggering on small signals in the presence of large signals, but since the user interface is frequency domain based, specifying a time domain feature for triggering is not practical. Correlation based triggering techniques may also respond to similar shaped features in the input signal independent of the specified level of those features, thus making it difficult to isolate a particular feature. The output of a correlation trigger is ambiguous and can be difficult to interpret precisely. Frequency selective triggering, like frequency mask triggering, allows for triggering on small signals in the presence of large signals, but only when the signal of interest is isolated in the frequency domain via filtering selected by a frequency domain based interface. Within the selected frequency range, frequency selective triggering suffers from the same level based limitations in the time domain described above. Frequency mask gating allows display of only the frequency domain features of interest within a real-time continuous gap free measurement process, but otherwise lacks the ability to do so for time domain features. In those cases where level based triggering is suitable, data is lost between the end of one acquisition and the next trigger.

SUMMARY

In a representative embodiment, a real-time spectrum analyzer for measuring time domain data of an input signal includes an analog to digital converter (ADC), a resampler, a density histogram memory unit, and a display unit. The ADC has a first sample rate and is configured to acquire and digitize the input signal at the first sample rate to provide a plurality of first samples. The resampler has an arbitrary second sample rate and is configured to acquire first samples at the second sample rate to provide a plurality of second samples grouped in sample sets. The second sample rate is selected so that each sample set comprises an integer number of second samples per an integer number of periods at a frequency of interest of the input signal. The density histogram memory unit is configured to store at least a portion of the second samples output by the resampler for generating a continuous real-time gap-free density histogram corresponding to the time domain data. The display unit is configured to receive the at least a portion of the second samples stored in the density histogram memory unit, and to display the generated continuous real-time gap-free density histogram.

In another representative embodiment, a method executed by a real-time spectrum analyzer provides a density histogram of time domain data from an input signal in real-time. The method includes sampling the input signal at a first sample rate to provide a continuous gap-free stream of a plurality of first samples corresponding to the time domain data; resampling the first samples at a second sample rate, different from the first sample rate, to provide a continuous gap-free stream of a plurality of second samples corresponding to the time domain data grouped in sample sets; storing at least a portion of the second samples for generating a continuous real-time gap-free density histogram corresponding to the time domain data; and displaying the generated continuous real-time gap-free density histogram. The second sample rate is selected so that each sample set includes an integer number of samples of the second samples per an integer number of periods at a frequency of interest of the input signal.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
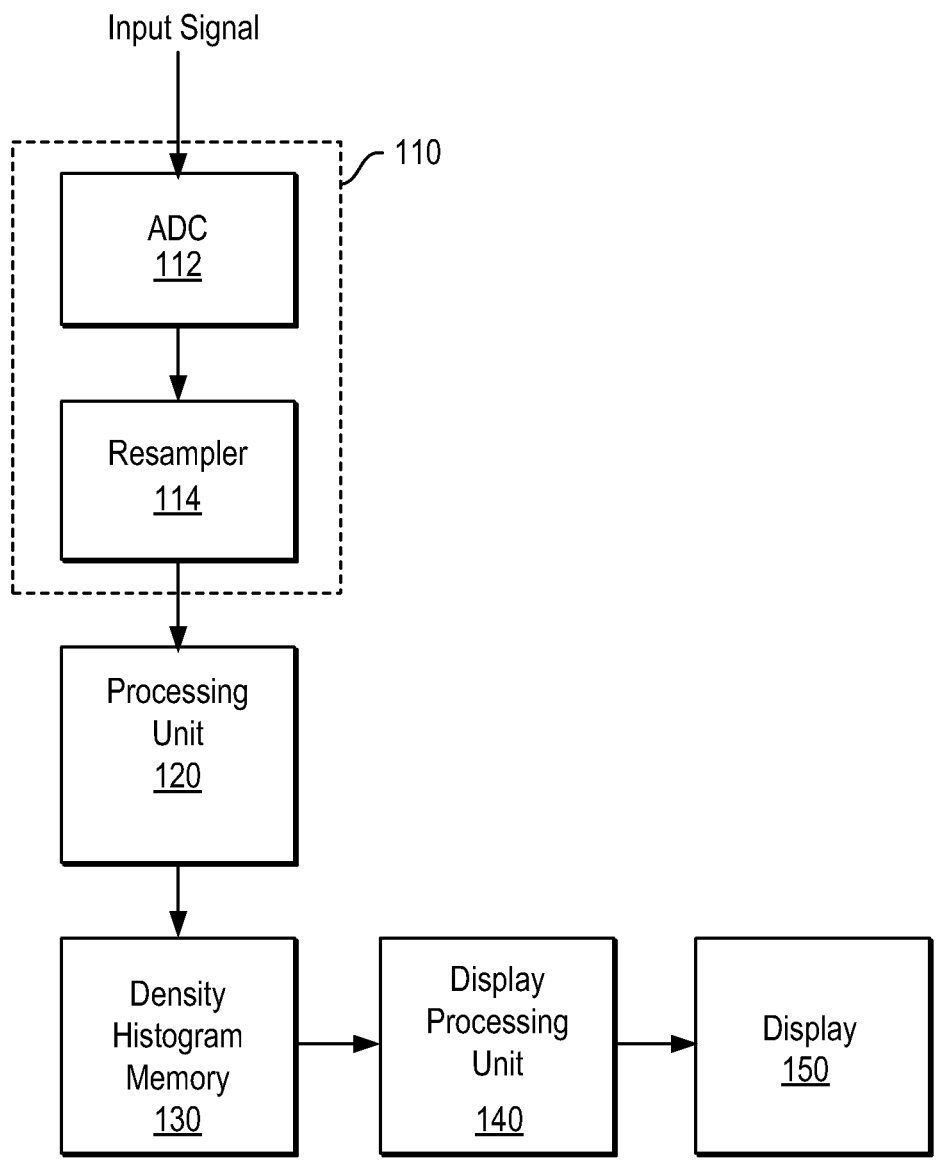
FIG. 1 is a simplified block diagram of a real-time spectrum analyzer (RTSA), according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

According to various embodiments, every time domain sample of a signal of interest (time domain input signal) is able to be displayed continuously in real-time with no gaps for an arbitrary amount of time, e.g., not limited by the amount of memory in the instrument. Users are able to see the entire time domain input signal with full time domain resolution of the sample rate of an analog-to-digital converter (ADC) used for signal acquisition. In contrast with a conventional oscilloscope, for example, no data is lost in gaps between the end of one acquisition responsive to one trigger and the beginning of the next acquisition responsive to a subsequent trigger. Also, a frequency range of the time domain input signal, represented by the time domain samples, may be isolated. In contrast with a conventional RTSA using the PvT feature, for example, all of the individual time domain samples are displayed separately, as opposed to aggregately, providing better time resolution and the ability to better distinguish individual features in the data. Also, in contrast with a conventional RTSA using a time domain histogram, the gap free display of a signal may be kept stable on the display because sample rate may be synchronized with the frequency of the signal of interest.

Further, according to various embodiments, the RTSA may further include a time mask detector and a time mask gate configured to use trigger condition information from time domain samples to make triggering and/or gating decisions. According to the gating decisions, time domain samples meeting the trigger condition(s) are stored in memory and displayed, and time domain samples that do not meet the trigger condition(s) are blocked from memory. For example, if 10,000 sample sets consisting of time domain samples from a continuous gap-free stream of time domain data are obtained for a histogram slice, and 50 of the sample sets include samples that meet the trigger condition, then only the 50 sample sets will be written into memory for the histogram slice, and displayed. If none of the time domain samples meet the trigger condition, then no time domain sample sets will be written into memory. Regardless, a continuous gap-free series of slices are sent to the memory for histogram display updates. That is, some of the slices may be empty if no corresponding time domain samples meet the trigger condition, thus producing blank display(s) until at least one time domain sample in a slice meets the trigger condition. The end result is a continuous gap-free visual display of only those time domain samples meeting the trigger condition. Triggering decisions may also be used to cause a trigger that begins the process of storing samples to histogram memory (or other memory), and stores a specified number of samples per trigger regardless of whether the condition continues to be met in subsequent sample sets. This is essentially time mask triggering with time mask gating turned off, as discussed below.

Notably, a histogram slice corresponds to a display update and will typically include 10,000 sample sets. The sample sets are overlayed on each other in the histogram format and displayed. A histogram display update is typically done about every 30 msec. while a sample set may only be a few microseconds.

FIG. 1 is a simplified block diagram of a real-time spectrum analyzer, according to a representative embodiment.

Referring to FIG. 1, RTSA 100 includes a signal acquisition unit 110, a processing unit 120, a density histogram memory 130, a display processing unit 140, and a display unit 150. In the depicted embodiment, the signal acquisition unit 110 includes an analog-to-digital converter (ADC) 112 and a resampler 114. Of course, the signal acquisition unit 110 may include various additional components (not shown) for frequency conversion and filtering the input signal, as would be normal in a spectrum analyzer and apparent to one of ordinary skill in the art. The ADC 112 is configured to receive and sample an input signal at a predetermined first sample rate, and to output digital first samples representing the input signal in the time domain. For example, the input signal may be an electrical or optical signal output from a device under test (DUT) being analyzed by the RTSA 100. The resampler 114 is configured to receive and sample the first samples at a second sample rate, and to output digital second samples representing the input signal in the time domain. The first sample rate may be a fixed sample rate and the second sample rate may be an arbitrary sample rate. An arbitrary sample rate is a sample rate that can be determined and set based on various criteria (i.e., not fixed). The resampler 114 (and/or the ADC 112) has the ability to lock its frequency reference to a frequency reference (if available) of the DUT or to a frequency of interest of the input signal. That is, the frequency reference for the second sample rate and/or the first sample rate may be locked to an external frequency reference, for example. In an embodiment, the functionality of the resampler 114 may be combined with that of the ADC 112, where the ADC 112 has an arbitrary sample rate.

The arbitrary sample rate of the resampler 114 is adjustable and may depend on the frequency of interest of the input signal, for example, thus providing a second sample rate different from the first sample rate. To prevent display drift, the second sample rate may be selected so that there are an integer number of second samples per an integer number of periods (or wavelengths) at the frequency of interest. Stated differently, the resampler 114 is configured to acquire the first samples at the second sample rate to provide a second samples, which are grouped in sample sets. The second sample rate is adjusted so that each of the sample sets includes an integer number of second samples per an integer number of periods at a frequency of interest of the input signal. For example, each sample set may include an integer number of second samples per one period at the frequency of interest, or an integer number of second samples per multiple periods (two or more) at the frequency of interest, without departing from the scope of the present teachings.

As mentioned above, in an alternative embodiment, the signal acquisition unit 110 may include the ADC 112, but no resampler 114. In this case, the ADC 112 has an arbitrary sample rate and the ability to lock its frequency reference to a frequency reference (if available) of the DUT. Therefore, the sample rate can be adjusted, for example, based on the frequency of interest of the input signal. That is, the sample rate may be selected so that there are an integer number of samples of the second samples per an integer number of periods at the frequency of interest, as discussed above. Although this embodiment eliminates the need for a separate resampler 114, it would require a more complex and likely more expensive ADC 112 with adjustable sampling capability built in.

The second samples of the time domain data are output by the signal acquisition unit 110 to the processing unit 120. The processing unit 120 may perform various processing functions on the second samples, including mapping the second samples into the density histogram memory 130. The density histogram memory 130 may be a double buffered memory, for example, including a first buffer and a second buffer. The display processing unit 140 creates a density histogram display, based on the contents of the density histogram memory 130, for visual display on the display unit 150. Optional frequency conversion and filtering (not shown) may be provided to enable isolation of a particular frequency range of the input signal prior to conversion into time domain samples.

In an embodiment, the density histogram memory 130 is a two dimensional memory, with horizontal addresses representing time and vertical addresses representing amplitude. The number of horizontal addresses is equal to the integer number of second samples in each sample set, and the number of vertical addresses provides a predetermined amplitude resolution for measurement of the input signal. For example, the number of horizontal addresses may be no more than 821 and the number of vertical addresses may be 225, although other numbers may be incorporated. Each second sample of the time domain signal is mapped to an address in the density histogram memory 130 by its amplitude and time information. Each time a second sample is mapped to the density histogram memory 130, that memory location is read, incremented, and written back. Accordingly, the density histogram memory 130 comes to represent how many times a second sample of a particular time and amplitude arrived at each memory location.

The choosing of the second sample rate and mapping of the sample sets to the horizontal addresses of the density histogram memory 130 may be accomplished using various different algorithms, e.g., as selected by the user. The sample sets may be mapped sequentially, that is sample set points 1 through 821 map to horizontal addresses 1 through 812, respectively. Alternately, the sample sets may be mapped N samples per address with N sample sets needed to cover all addresses (e.g., each 5 sequential sample sets into one horizontal address before moving to the next address, and requiring 5 sample sets to cover all 821 addresses). Also, the sample sets may be mapped non-sequentially, so that the address increment is greater than one and thus the available display times may be shorter than 821 samples at the fastest available second sample rate. Examples of mappings are provided in the discussion of FIGS. 6A through 8B, below.

Typically, time domain signal displays use a display time based interface. That is, the user sets the amount of time that the horizontal axis of the display unit 150 will represent. When the user selects this method, the requested display time will be modified by the minimum amount necessary to display an integer number of periods of the selected frequency. Then the highest possible second sample rate (widest possible bandwidth) that can generate a sample set worth of points will be used. The mapping of sample set points to horizontal addresses will use N samples per address if possible. The next choice would be sequential mapping, and the last choice would be non-sequential mapping.

Alternately, the user may select a desired bandwidth (allowed for and controlled by the arbitrary sample rate) in which to measure the signal to be the dominant factor instead of the display time. In this case, the bandwidth (second sample rate) will be modified by the minimum amount necessary to have a sample set represent an integer number of periods. Then the display time will be modified by the minimum necessary so that a sample set displays an integer number of periods while keeping the second sample rate as constant as possible. With bandwidth as the dominant control, the mapping technique will be modified as needed to best satisfy the desired bandwidth and display time.

The density histogram memory 130 may be any suitable type of non-transitory computer readable medium that is writable readable, including random access memory (RAM), such as static RAM (SRAM), a disk drive, a CD, a DVD, a universal serial bus (USB) drive, and the like. In an embodiment, the computer readable medium may be RAM embedded as Block RAM in the field-programmable gate arrays (FPGAs) used to implement the processing unit 120, discussed below. A non-transitory computer readable medium distinguishes from a propagating signal.

The processing unit 120 and the display processing unit 140 may be implemented using one or more processing devices, such as a processor, a microprocessor, a digital signal processor (DSP), one or more application specific integrated circuits (ASICs), one or more FPGAs, or combinations thereof, using software, firmware, hard-wired logic circuits, or combinations thereof. The processing unit 120 and the display processing unit 140 may have access to memory (not shown), comprising a non-transitory computer readable medium for storing operating software, modules, data and algorithms for executing the various embodiments described herein. Examples of a computer readable medium include various types of nonvolatile read only memory (ROM) and volatile RAM, such as SRAM, Block RAM, a disk drive, EPROM, EEPROM, a CD, a DVD, a USB drive, and the like.

In an embodiment, the display processing unit 140 may color code the time and amplitude information, so that locations on the display unit 150 having a larger number of samples are shown in one color and locations on the display unit 150 having a smaller number of samples are shown in a different color. In this case, the color of the visual display unit 150 then represents the density histogram of the input signal in the time domain. The display processing unit 140 may also provide a variable persistence feature. According to the variable persistence feature, when a specified number of wavelengths (or periods) of the input signal have been captured, one of the buffers of the density histogram memory 130 has its contents transferred to the display processing unit 140, while the other buffer of the density histogram memory 130 captures second samples mapped by the processing unit 120. Thus, one buffer is always in use to capture second samples while the contents of the other buffer are being displayed. The variable persistence feature allows signal features to be visually displayed on the display unit 150 longer than the capture time of a single buffer.

Locking the second sample rate to the frequency of interest of the input signal may be accomplished in a variety of ways, without departing from the scope of the present teachings, an example of which is discussed below with reference to FIG. 2. For example, if the frequency of interest is known, the user may enter it. If the frequency of interest unknown, it may be measured in a very narrow span by the measurement capability of the RTSA 100. If frequency drift is detected, the second sample rate can be adjusted, either manually or by automatic measurement. Alternately, some horizontal memory locations beyond the integer number of a sample set needed for the nominal frequency can be reserved to occasionally provide an adjustment to the alignment of the display unit 150, while still not missing any of the second samples. These extra locations may be used in conjunction with a triggered alignment, for example, which uses edge information from the second samples to occasionally add or subtract one horizontal location from being used to keep the display unit 150 from drifting while still displaying every time domain second sample.

Figure 2:
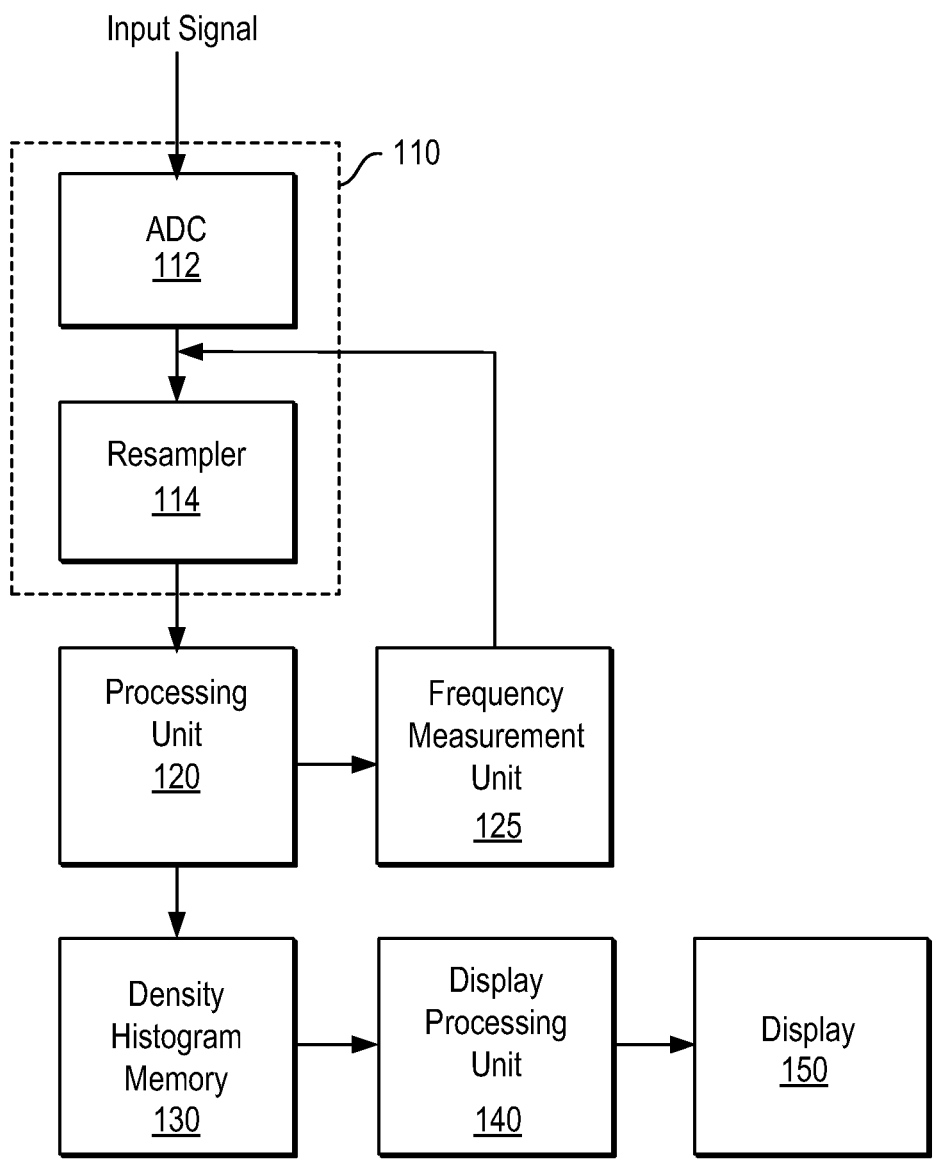
FIG. 2 is a simplified block diagram of a RTSA, according to a representative embodiment.

FIG. 2 is a simplified block diagram of a RTSA, according to a representative embodiment.

Referring to FIG. 2, RTSA 200 includes signal acquisition unit 110, processing unit 120, density histogram memory 130, display processing unit 140, and display unit 150, as discussed above with reference to FIG. 1. In addition, the RTSA 200 includes a frequency measurement unit 125 in communication with the signal acquisition unit 110 and the processing unit 120.

The frequency measurement unit 125 is configured to identify the frequency of interest of the input signal, which may be used by the signal acquisition unit 110 to determine and set the second sample rate. In an embodiment, the frequency measurement unit 125 may include a fast Fourier transform (FFT) engine (not shown) configured to perform fast Fourier transforms on the time domain second samples received from the signal acquisition unit 110. The FFT engine provides a continuous gap-free stream of FFT spectra corresponding to the time domain input signal in the frequency domain, thereby converting the time domain data (second samples) to frequency domain data. The FFT spectra may be used to identify the frequency of interest of the input signal. Alternately, the FFT engine may be programmed to periodically measure the frequency of the input signal in a non-gap free manner that allows for better frequency resolution than afforded by the gap free technique. A control signal indicating the identified frequency of interest is fed back to the signal acquisition unit 110 (e.g., the resampler 114, in particular), which adjusts the second sample rate based on the identified frequency of interest. For example, the frequency of interest may be identified as the FFT spectrum having the dominant frequency (greatest magnitude).

Although depicted separately, it is understood that the frequency measurement unit 125 may be incorporated within the processing unit 120, without departing from the scope of the present teachings. The frequency measurement unit 125 may be implemented as software, firmware and/or hardware modules using the same or different processing devices. The frequency measurement unit 125 and/or the processing unit 120 may have access to memory (not shown), comprising a non-transitory computer readable medium for storing operating software, modules, data and algorithms for executing the various embodiments described herein.

Figure 3:
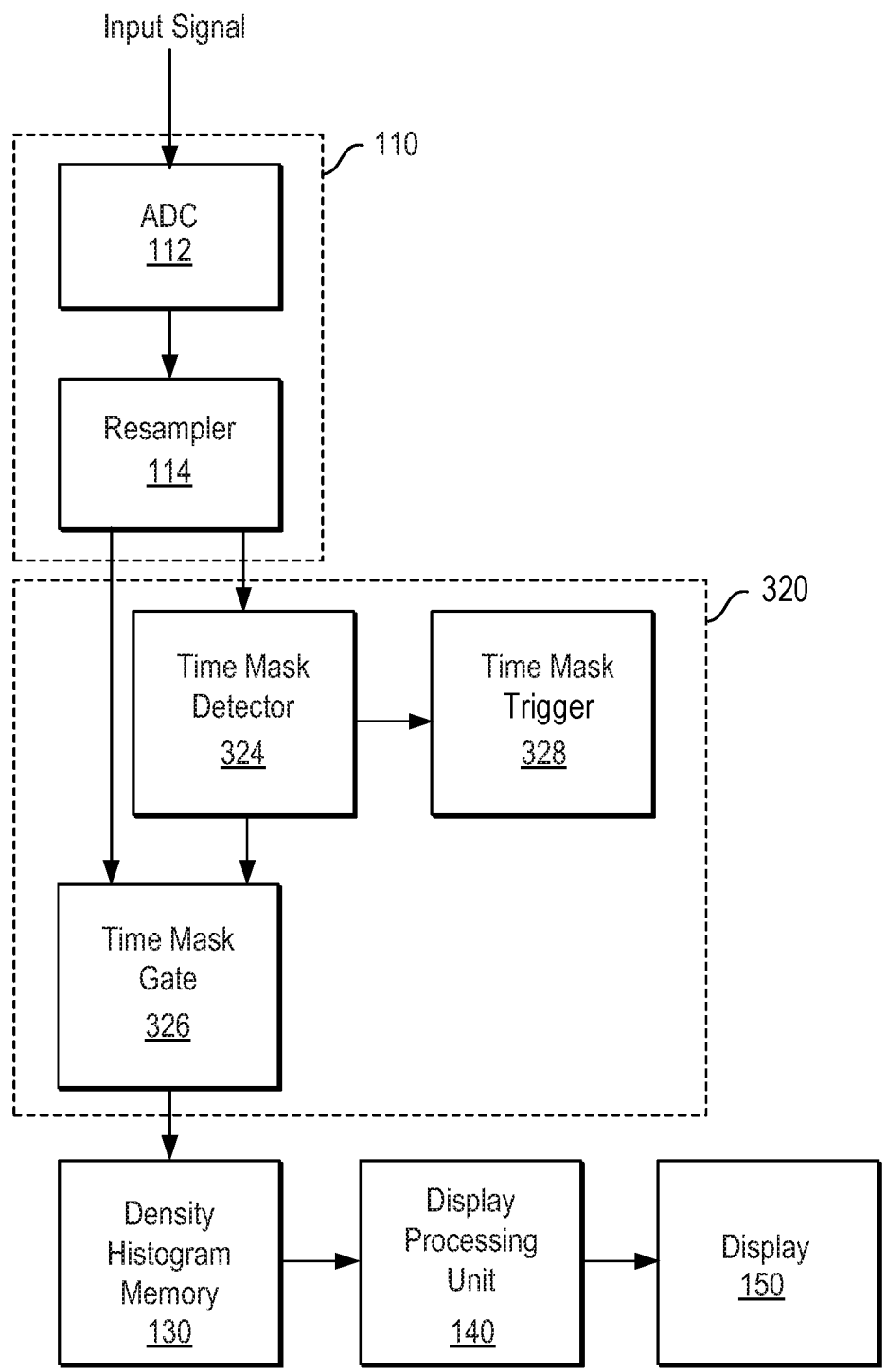
FIG. 3 is a simplified block diagram of a RTSA, according to a representative embodiment.

FIG. 3 is a simplified block diagram of a RTSA, according to a representative embodiment.

Referring to FIG. 3, RTSA 300 includes signal acquisition unit 110, density histogram memory 130, display processing unit 140, and display unit 150, as discussed above with reference to FIG. 1. In addition, the RTSA 300 includes a processing unit 320, in place of the processing unit 120, to enable time mask detection and triggering. Although not shown in FIG. 3, it is understood that the RTSA 300 may further include a frequency measurement unit 125, as discussed above with reference to FIG. 2.

In the depicted embodiment, the processing unit 320 includes a time mask detector 324, a time mask gate 326 and a time mask trigger 328. Both the time mask detector 324 and the time mask gate 326 receive the time domain second samples from the signal acquisition unit 110. The time mask detector 324 is configured to detect one or more previously determined triggers, based on comparison to one or more associated time masks, by detecting corresponding trigger conditions in the second samples (within each sample set). The triggers and/or time masks may be user-defined. For example, a trigger may be based on time periods and/or amplitudes of the input signal in comparison with the time mask. Although more than one time mask and trigger may implemented by the RTSA 300, the discussion below is directed to a single time mask and trigger for convenience of explanation.

For example, the time mask detector 324 may receive second samples from the resampler 114 and determine whether each second sample meets at least one trigger condition of a time domain mask, which contains the same number of mask values as the integer number of second samples in each sample set. The time mask detector 324 may generate gate control signals corresponding to the second samples based on these determinations. The time mask gate 326 receives the second samples from the resampler 114 and the corresponding gate control signals from the time mask detector 324, and outputs only select sample sets that include second samples that meet the at least one trigger condition in response to the corresponding gate control signal. The density histogram memory 130 stores only the select sample sets output by the time mask gate 326 for generating in the density histogram.

In other words, for each sample set received from the signal acquisition unit 110, the time mask detector 324 determines whether second sample within the sample set meets the trigger condition associated with the predetermined trigger, thus identifying sample sets that contain at least one second sample that meets the trigger condition. The time mask detector 324 generates gate control signals corresponding to the sample sets received from the signal acquisition unit 110 based on the determination. That is, each gate control signal reflects whether the corresponding sample set includes one or more second samples meeting the trigger condition. For example, when a sample set includes at least one second sample that meets a trigger condition, the time mask detector 324 generates a positive gate control signal (e.g., the value of the gate control signal corresponding to that sample set may be set to one or high), and when a sample set does not include any second samples that meet the trigger condition, the time mask detector 324 generates a negative gate control signal (e.g., the value of the control signal corresponding to that sample set may be set to zero or low). Of course, the gate control signals may vary according to various configurations without departing from the scope of the present teachings.

The time mask gate 326 is configured to receive the sample sets from the signal acquisition unit 110 and to selectively gate the sample sets into the density histogram memory 130 for ultimate display based on the corresponding gate control signals provided by the time mask detector 324. For example, the time mask gate 326 may write into the density histogram memory 130 each sample set having a corresponding positive gate control signal, and not write into the density histogram memory 130 each sample set having a corresponding negative gate control signal. Of course the roles of the positive and negative gate control signals may be reversed in various embodiments, without departing from the scope of the present teachings. Generally, the time mask detector 324 and the time mask gate 326 work together synchronously on sample sets in the order they are received. Alternately, if the gating function is not used, the time mask detector 234 may simply generate a trigger signal that starts the writing of samples to memory and essentially ignores whether subsequent sample sets also meet the trigger condition.

The sample sets are grouped into slices for updating the histogram display. The grouping is based on the number second samples that form an integer number of sample sets. For example, since displays may not be updated as quickly as memories, a slice may contain thousands of sample sets. The grouping of sample set may be performed by the resampler 114 as it samples the first samples, or by components of the processing unit 320 in FIG. 3 (or processing unit 120 in FIGS. 1 and 2), such as programmable registers, digital logic control, and memory controller (not shown), as would be apparent to one of ordinary skill in the art. The number of samples sets in each slice may be programmed as a fixed number, e.g., in a programmable register, or can be controlled via an interrupt signal, e.g., from a memory controller.

The density histogram memory 130 is configured to output the stored sample sets to enable the display processing unit 140 to display on the display unit 150 corresponding slices of the histogram display during consecutive histogram display updates, respectively. For example, when one slice ends and another begins, two buffers within the density histogram memory 130 may be swapped to avoid interruption of the sample sets. When no sample sets spectra have been stored in the density histogram memory 130 for a particular slice, the display processing unit 140 provides a blank display on the display unit 150 for that (empty) slice during the corresponding histogram display update. The display unit 150 therefore is able to provide a continuous gap-free histogram display of only sample sets that include second samples meeting the trigger condition.

The processing unit 320 may also include the time mask trigger 328, which functions in essentially the same manner as a conventional frequency mask trigger. That is, the time mask trigger 328 is configured to trigger a batch mode capture of the sample sets (or the corresponding second samples) in response to a time mask trigger signal provided by the time mask detector 324. The time mask detector 324 provides the time mask trigger signal when any of the sample sets in a slice includes one or more second samples that meet one or more trigger conditions. In an embodiment, the display unit 150 may be further configured to display a density histogram generated in response to the batch mode capture, instead of a density histogram generated in response to the selective gating process using the gate control signals, discussed above.

The time mask detector 324, the time mask gate 326 and the time mask trigger 328, which are depicted separately for convenience of explanation, may be implemented as software, firmware and/or hardware modules using the same or different processing devices. The processing unit 320, like the processing unit 120 discussed above, may have access to memory (not shown), comprising a non-transitory, tangible computer readable medium for storing operating software, modules, data and algorithms for executing the various embodiments described herein.

Figure 4:
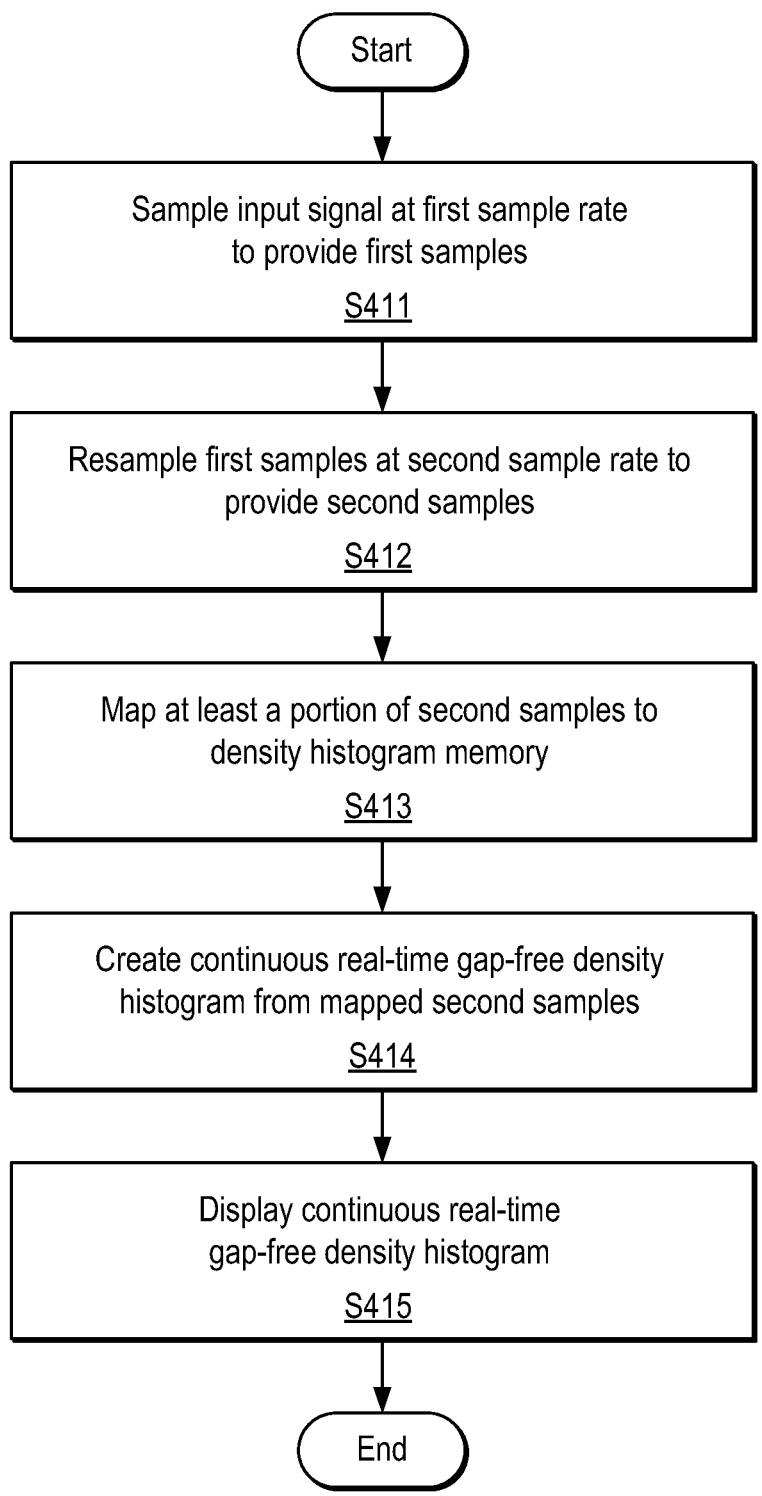
FIG. 4 is a flow diagram showing a method for storing and displaying real-time gap free time domain data, according to a representative embodiment.

FIG. 4 is a flow diagram showing a method executed by a RTSA for providing a density histogram of sampled time domain data from an input signal in real-time, according to a representative embodiment.

Referring to FIG. 4, the input signal is sampled at a first sample rate in block S411 to provide a continuous gap-free stream of first samples corresponding to the time domain data from the input signal. In block S412, the first samples are resampled at a second sample rate, different from the first sample rate, to provide a continuous gap-free stream of second samples corresponding to the time domain data. The second samples are grouped in sample sets, where the second sample rate is selected (and the sample rate of the resampler is adjusted accordingly) so that each sample set includes an integer number of second samples per an integer number of periods at a frequency of interest of the input signal. At least a portion of second samples are mapped to a density histogram memory in block S413, and a continuous real-time gap-free density histogram is created based on the mapped second samples in block S414. For example, the second samples may all be routed to either the first buffer or the second buffer of density histogram memory when the display unit is displaying a continuous gap-free stream of the second samples. The continuous real-time gap-free density histogram is displayed in block S415.

As discussed above, FFTs may be performed on the second samples to provide a FFT spectra corresponding to the time domain data of the input signal. Accordingly, a frequency of interest of the input signal may be identified based on the FFT spectra, and the second sample rate may be adjusted based on the identified frequency of interest.

Figure 5:
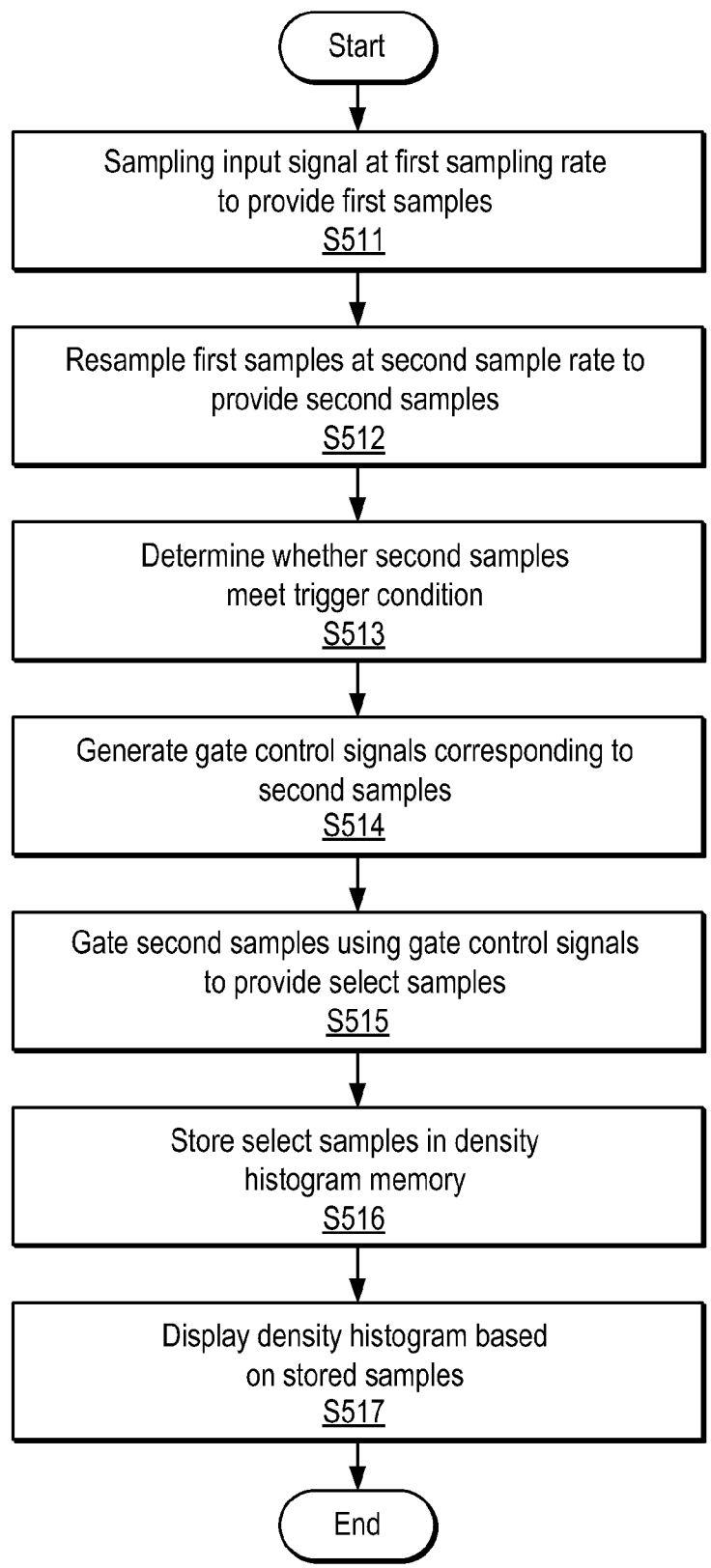
FIG. 5 is a flow diagram showing a method for storing and displaying real-time gap free time domain data in accordance with time masks, according to a representative embodiment.

FIG. 5 is a flow diagram showing a method executed by a RTSA for providing a density histogram of sampled time domain data, in accordance with time masks, from an input signal in real-time, according to a representative embodiment.

Referring to FIG. 5, the input signal is sampled at a first sample rate in block S511 to provide a continuous gap-free stream of first samples corresponding to the time domain data from the input signal. In block S512, the first samples are resampled at a second sample rate, different from the first sample rate, to provide a continuous gap-free stream of second samples corresponding to the time domain data. The second samples are grouped in sample sets, where the second sample rate is selected (and the sample rate of the resampler is adjusted accordingly) so that each sample set includes an integer number of second samples per an integer number of periods at a frequency of interest of the input signal.

Figure 6A:
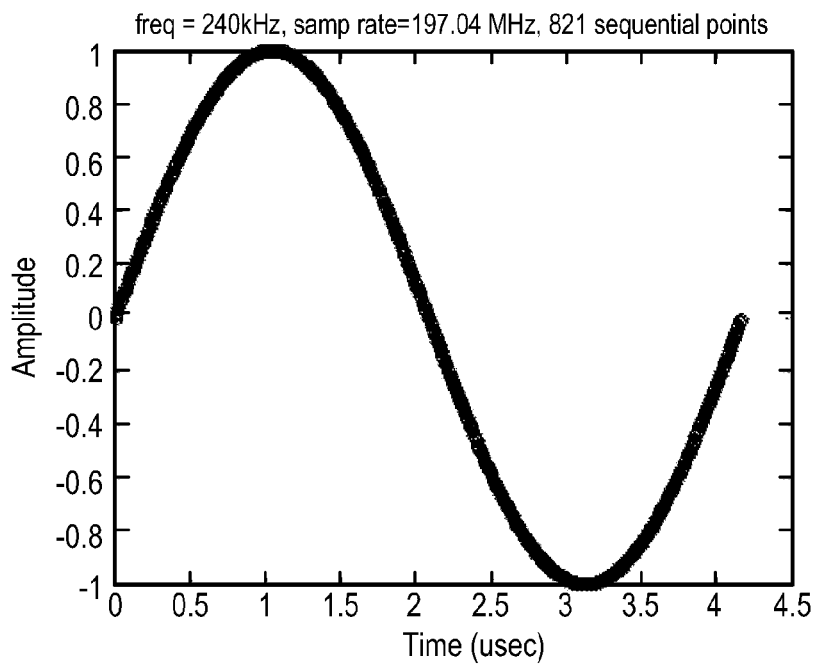
FIGS. 6A, 6B and 6C are views showing second samples in a sample set mapped to histogram display horizontal addresses, such that sequential samples map to sequential horizontal addresses, according to representative embodiments.
Figure 6B:
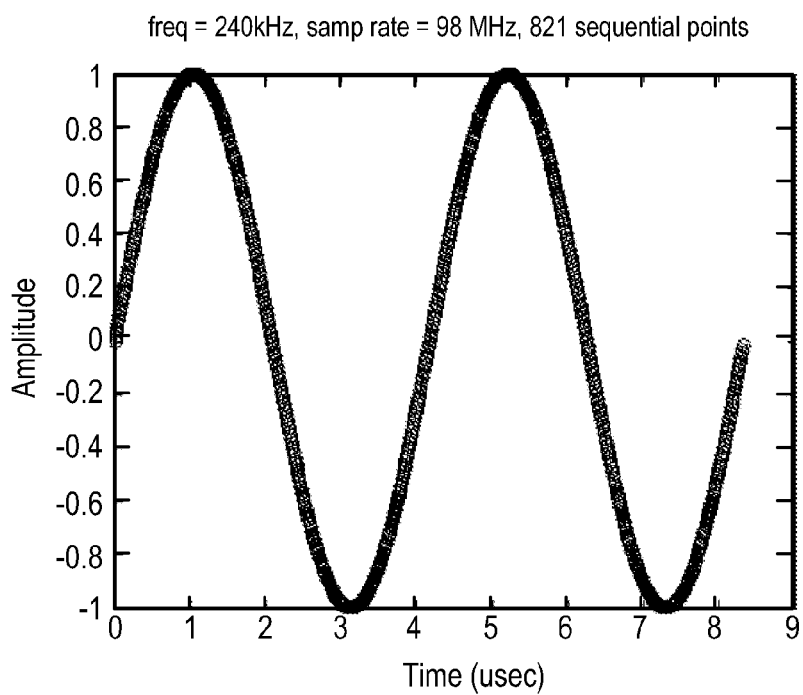
Figure 6C:
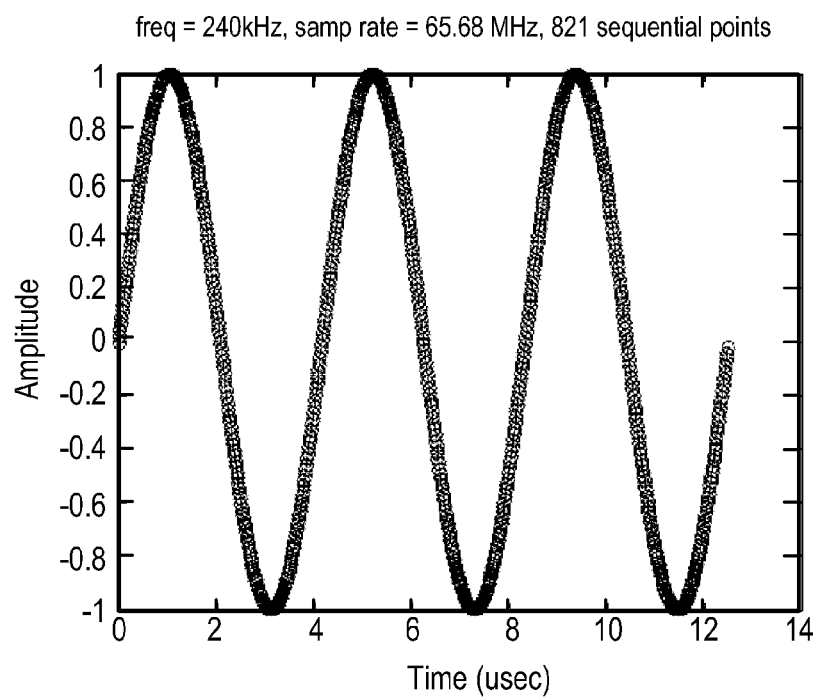

FIGS. 6A through 6C are views showing second samples in a sample set mapped to histogram display horizontal addresses, such that sequential samples map to sequential horizontal addresses, according to representative embodiments.

FIG. 6A illustrates how sample sets may be mapped to horizontal addresses sequentially. In this example, a sample set consists of 821 samples, and the user wishes to look at a signal with a frequency of 240 kHz (period of 4.1666667 μsec) with a display time of about 4.1666667 μsec. The sample rate may be set to 197.04 MHz and obtain 821 samples per 4.1666667 μsec. Sequential samples may be mapped to sequential horizontal addresses to show one period per sample set. If the sample rate were halved to 98.52 MHz, two periods per sample set would be provided as shown in FIG. 6B. If the sample rate is reduced by a factor of 3 to 65.68 MHz, three periods per sample set would be provided as shown in FIG. 6C. Using the sequential addressing of samples implies changing the sample rate by the same factor as the number of periods displayed.

FIGS. 7A through 7D are views showing second samples in a sample set mapped to histogram display horizontal addresses, such that sequential samples map to non-sequential horizontal addresses, according to representative embodiments.

Figure 7A:
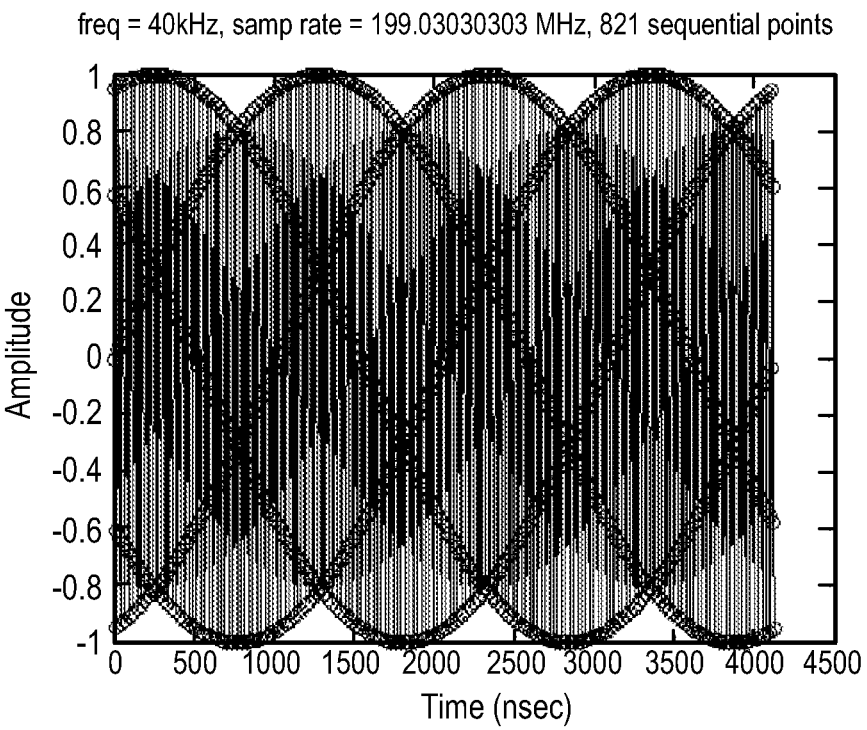
FIGS. 7A, 7B, 7C and 7D are views showing second samples in a sample set mapped to histogram display horizontal addresses, such that sequential samples map to non-sequential horizontal addresses, according to representative embodiments.
Figure 7B:
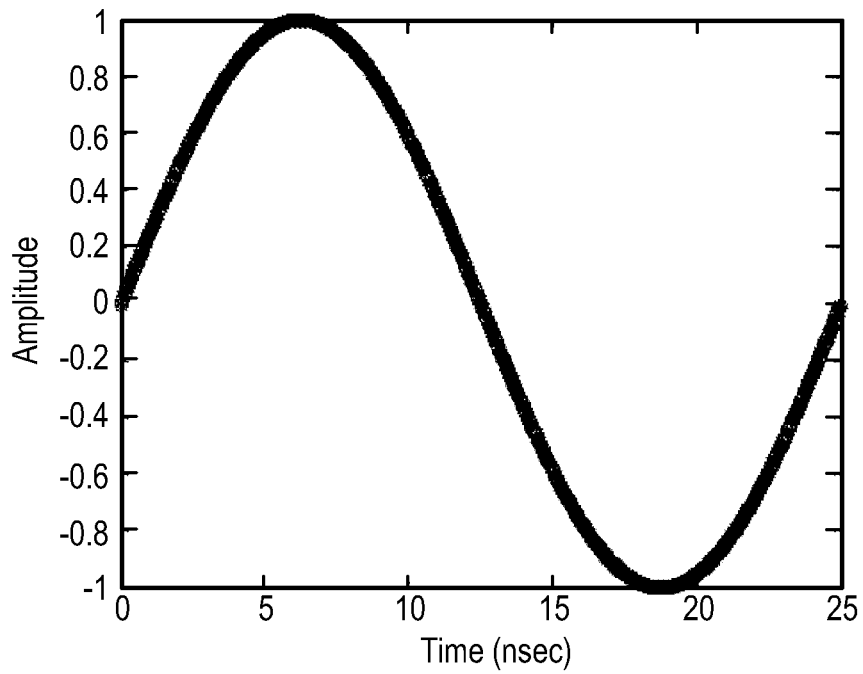

FIG. 7A and FIG. 7B illustrate how sample sets may be mapped to horizontal addresses non-sequentially to keep the bandwidth (e.g., second sample rate) reasonably stable as the display time is changed. In this example, a sample set consists of 821 samples, and the user wishes to look at a signal with a frequency of 40 MHz (period of 25 μsec) with a display time of 25 μsec. Since in the current embodiment the maximum second sample rate is 200 MHz, 821 samples cannot be provided in 25 μsec. The highest possible sample rate that still provides an integer number periods per sample set is 199.03030303 MHz (821*40 MHz/165), which would provide 821 samples per 165 periods. In FIG. 7A, sequential samples are mapped to sequential horizontal addresses to show that this would result in a display time of 4.125 μsec. In FIG. 7B, the same sequential samples are mapped to horizontal addresses that are 165 addresses apart, providing one period per sample set. Since 821 is a prime number, incrementing the horizontal address by any integer repeatedly will cause all 821 addresses to be written before any is repeated. In this case, although it took 165 periods to collect the sample set, if the signal is repetitive, the non-sequential mapping graphically represents a single period as if it were sampled 165 times faster. The arbitrary sample rate and prime number of samples per sample set allow a different horizontal address to be filled in until all are written before any horizontal address is repeated.

Figure 7C:
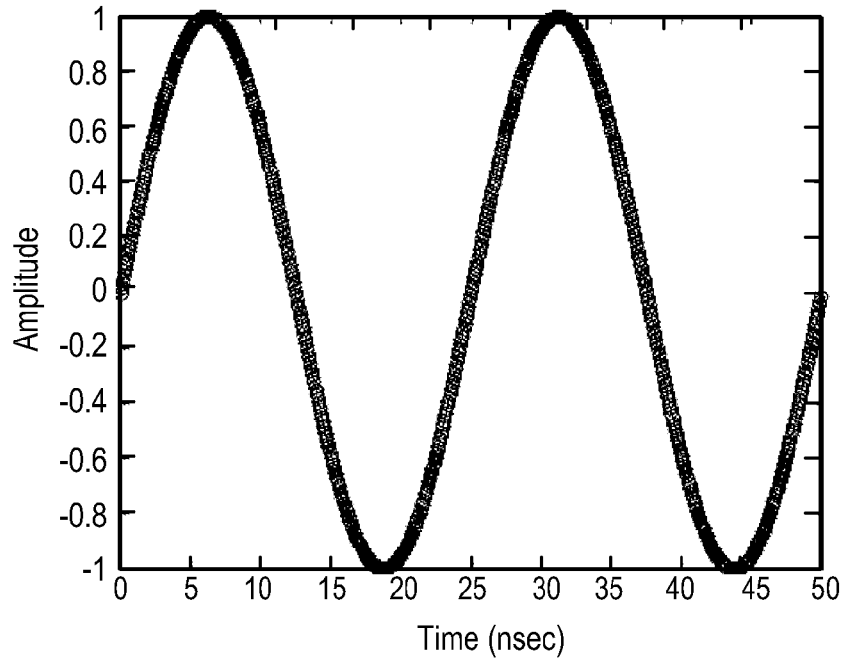

Referring to FIG. 7C, the display time is doubled from 25 μsec to 50 μsec., thus showing two periods of the 40 MHz signal. The address increment cannot be halved in this example (which would give the desired result) because it would result in a non-integer value. Therefore, a minor adjustment to the sample rate can be made so that 821 samples is 166 periods of 40 MHz, changing it to 197.831325301205 MHz (821*40 MHz/166), changing the address increment to 83 (166/2).

Figure 7D:
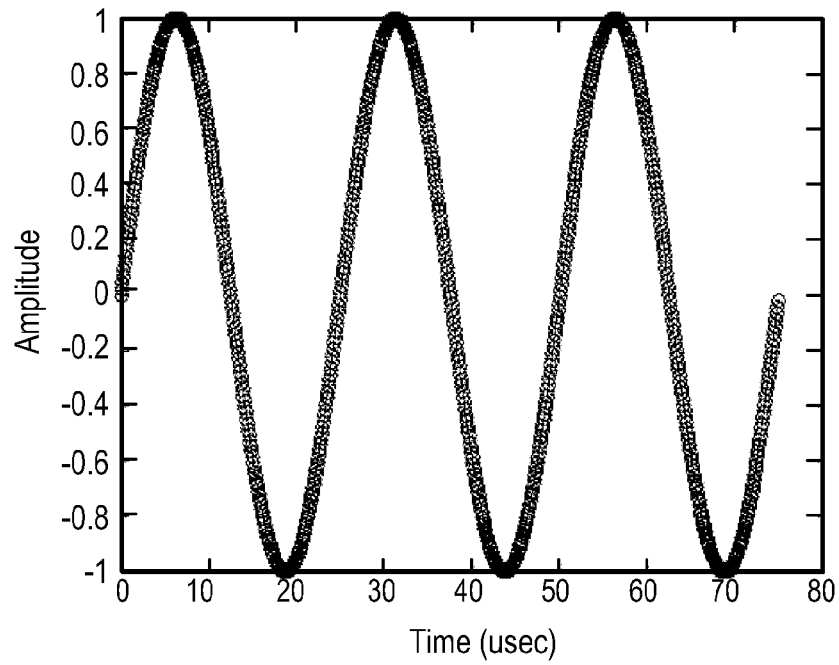

Referring to FIG. 7D, the display time is tripled from 25 μsec to 75 μsec, thus showing three periods of the 40 MHz signal. The user can now revert to the sample rate of FIG. 7A, and divide the address increment by three, from 165 to 55. Non-sequential addressing allows the number of periods displayed to be varied, while leaving the sample rate relatively unchanged. Although not illustrated in the figures, if the user wished to show four periods, the sample rate could be set to 195.4761905 MHz (821*40 MHz/168) to provide an address increment of 42 (168/4). For five periods, the user again reverts to the sample rate of FIG. 7A, and divides the address increment by five, changing the address increment from 165 to 33.

FIGS. 8A through 8D are views showing N second samples in a sample set mapped to histogram display horizontal addresses, such that N sequential samples map to the same horizontal address and N sample sets are needed to write to all available horizontal addresses, according to representative embodiments.

Figure 8A:
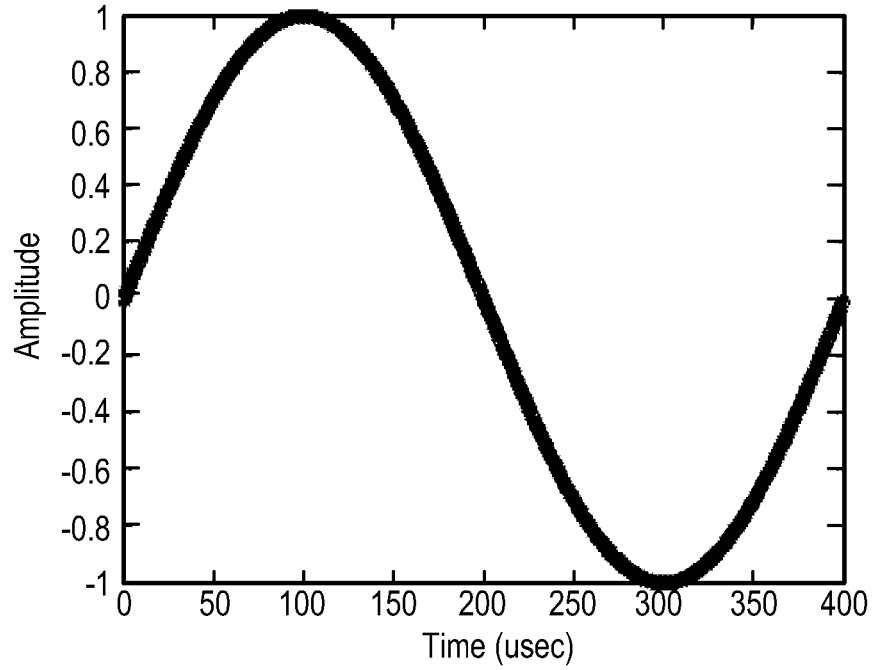
FIGS. 8A, 8B, 8C and 8D are views showing N second samples in a sample set mapped to the histogram display horizontal addresses, such that N sequential samples map to the same horizontal address and N sample sets are needed to write to all available horizontal addresses, according to representative embodiments.
Figure 8B:
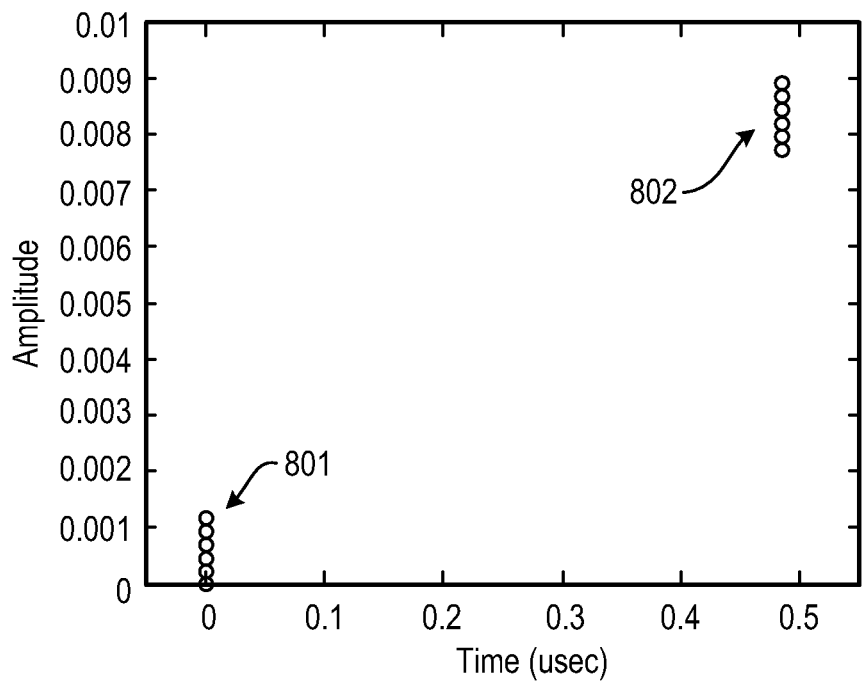

FIG. 8A illustrates how N samples may be mapped per single horizontal address so that N sample sets are used to cover the entire number of horizontal addresses. In this example, a sample set consists of 821 samples, and the user wishes to look at a signal with a frequency of 2.5 kHz (period of 400 μsec) with a display time of 400 μsec. The sample rate may be set to 10.2625 MHz, to provide five times 821 samples (five sample sets) per 400 μsec. Then, five samples would be written to the first horizontal address, then five samples would be written to the second horizontal address, etc. until the five sample sets are mapped five samples to each horizontal address. FIG. 8B zooms in on the first two addresses of FIG. 8A to show that five values were written to each, indicated by reference numerals 801 and 802.

Figure 8C:
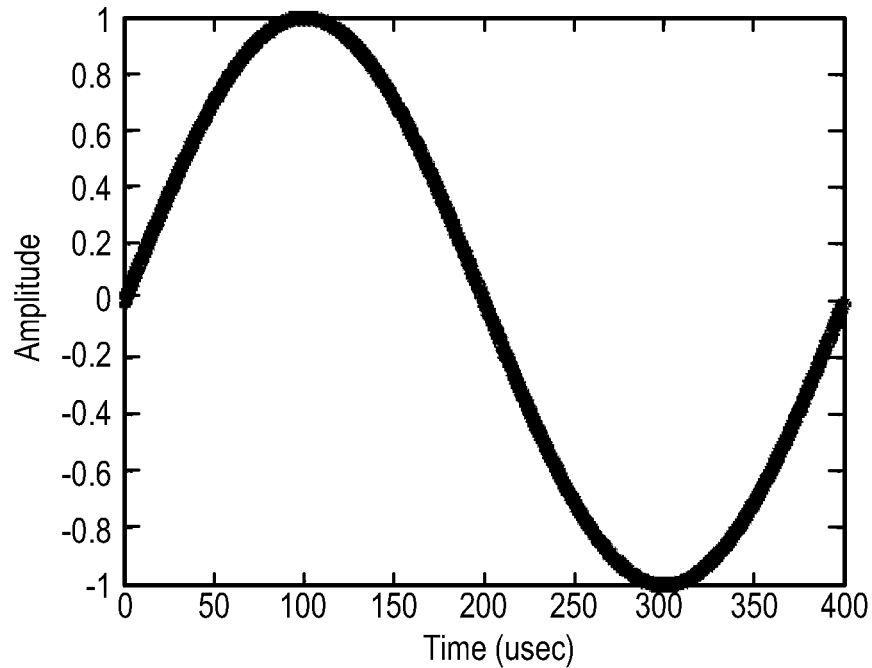
Figure 8D:
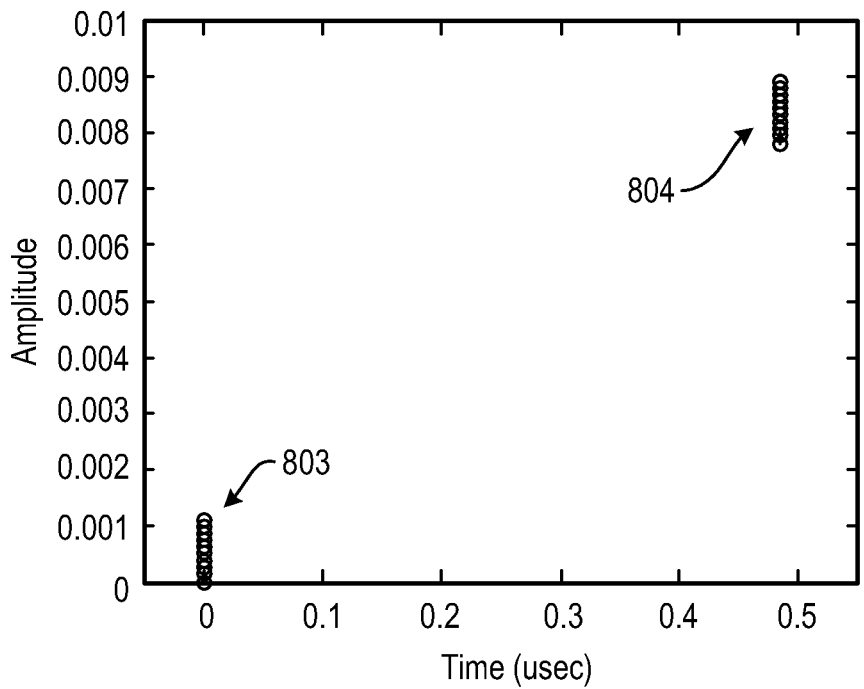

FIG. 8C illustrates how the sample rate may be doubled to 20.525 MHz, for example, while still showing a single period of the signal, by writing ten samples to each horizontal address instead of five. FIG. 8D zooms in on the first two addresses of FIG. 8C to show that 10 values were written to each, indicated by reference numerals 803 and 804.

Referring again to FIG. 5, in block S513, it is determined whether second samples from each of the sample sets meets one or more predetermined trigger conditions (e.g., by applying one or more time masks). Gate control signals corresponding to second samples are generated in block S514 based on whether the second samples meet the one or more predetermined trigger conditions. In block S515, the second samples are gated using the gate control signals generated in block S514 to provide select samples, and the select samples are stored in the density histogram memory in block S516. In an embodiment, select sample sets are stored in the density histogram memory when at least one of the second samples in the sample set has been determined to meet the one or more trigger conditions in block S513. A density histogram based on the stored samples is displayed in block S517. When time mask gating is off, the density histogram is gap free and continuous in the sense that all second samples are displayed and none missed. When the time mask gating is on, the density histogram is gap free and continuous in the sense that all sample sets meeting the gate condition are captured and displayed with none missed.

Figure 9:
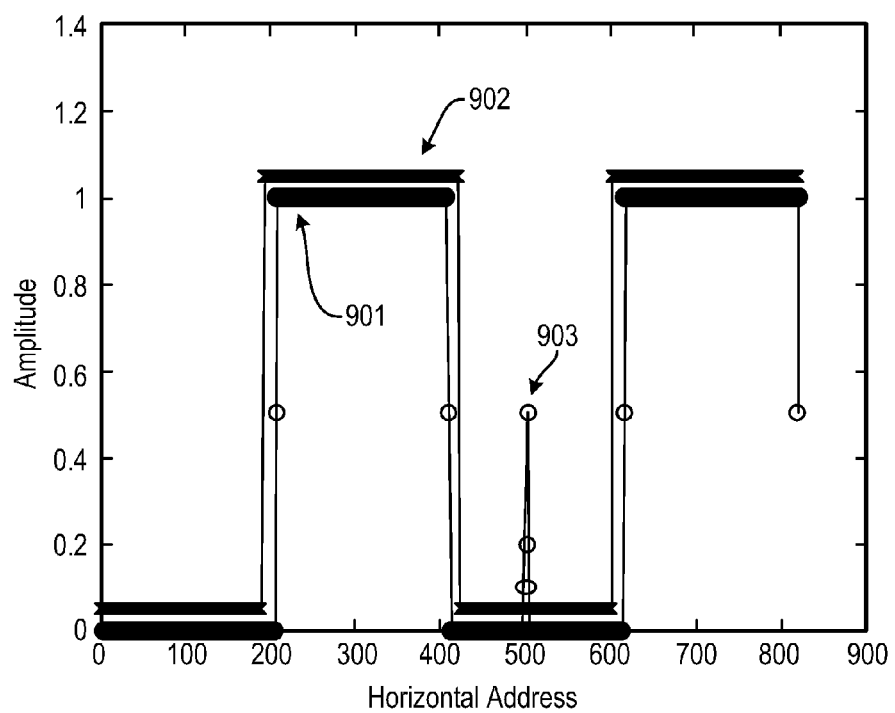
FIG. 9 is a view of a time mask being compared to a signal of interest for creating a trigger, According to representative embodiments.

FIG. 9 is a view of a time mask being compared to a signal of interest for creating a trigger, According to representative embodiments.

FIG. 9 illustrates two periods of a square wave of a signal of interest 901, compared to a time mask 902. A transient signal 903 has a maximum amplitude lower than the maximum amplitude of the signal of interest 901 violating the time mask 902 to generate a trigger signal. Because the transient signal 903 has lower maximum amplitude than the main signal of interest 901, level based triggers are essentially useless. That is, the main signal of interest 901 would cause a trigger constantly regardless of whether the transient signal 903 was present. Since the transient signal 903 is very short in duration (impulsive), it would be very spread out in the frequency domain and almost impossible to trigger using a frequency mask trigger. The combination of being able to keep the main signal of interest 901 stable (using arbitrary sample rate) and the time mask 902 enables triggering on the transient signal 903 in a way that conventional oscilloscopes and RTSA implementations can not.

The operations discussed above with reference to FIGS. 4 and 5 may be included in logic executable by a computer processor or other processing device, such as the processing unit 120, 320, discussed above, and/or some combination of processing devices (e.g., by distributed processing). The operations may be implemented using internal logic or software, stored on a computer readable medium, and executable by one or more computer processors, ASICs, FPGAs or combinations thereof, as discussed above.

Various embodiments enable continuous display of gap free time domain data, sampled at a sample rate that is adjustable to prevent drift, which provides advantages over conventional oscilloscopes and RTSAs. For example, as compared to a conventional oscilloscope, no data is lost in gaps between the end of one acquisition in response to an initial trigger and the arrival of a next trigger to start the next acquisition. Also, a frequency range of the input signal, which the time domain samples represent, may be isolated. As compared to the PvT Feature of a conventional RTSA, for example, all individual time domain samples are displayed, thus providing better time resolution and the ability to better distinguish individual features in the time domain data.

In addition, various embodiments provide the ability to display and update a gap-free density histogram showing only time domain samples (or samples sets containing time domain samples) meeting one or more frequency mask conditions. The continuous gap free process may be applied to both the density histogram and real-time spectrum features of a real-time spectrum analyzer.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A real-time spectrum analyzer for measuring time domain data of an input signal, the real-time spectrum analyzer comprising:
   an analog to digital converter (ADC) having a first sample rate and configured to acquire and digitize the input signal at the first sample rate to provide a plurality of first samples;
   a resampler having an arbitrary second sample rate and configured to acquire the plurality of first samples provided by the ADC at the second sample rate to provide a plurality of second samples grouped in sample sets, wherein the second sample rate is selected so that each sample set comprises an integer number of second samples per an integer number of periods at a frequency of interest of the input signal;
   a density histogram memory unit configured to store at least a portion of the plurality of second samples output by the resampler for generating a continuous real-time gap-free density histogram corresponding to the time domain data; and
   a display unit configured to receive the at least a portion of the plurality of second samples stored in the density histogram memory unit, and to display the generated continuous real-time gap-free density histogram.

2. The real-time spectrum analyzer of claim 1, wherein the density histogram memory comprises a two dimensional memory comprising horizontal addresses representing time and vertical addresses representing amplitude, and the number of horizontal addresses is equal to the integer number of second samples in each sample set, and the number of vertical addresses provides a predetermined amplitude resolution.

3. The real-time spectrum analyzer of claim 1, further comprising:
   a fast Fourier transform (FFT) engine configured to perform FFTs on the plurality of second samples to provide FFT spectra corresponding to the time domain data, wherein the FFT spectra are used to identify the frequency of interest, which is fed back to the resampler for adjusting the second sample rate.

4. The real-time spectrum analyzer of claim 1, further comprising:
   a processing unit comprising:
   a time mask detector configured to receive the plurality of second samples from the resampler and to determine whether each second sample of the plurality of second samples meets at least one trigger condition of a time domain mask, which contains the same number of mask values as the integer number of second samples in each sample set, and to generate a plurality of gate control signals corresponding to the plurality of second samples based on the determinations; and
   a time mask gate configured to receive the plurality of second samples from the resampler and the plurality of gate control signals from the time mask detector, and to output only select sample sets of the plurality of second samples that meet the at least one trigger condition in response to the corresponding gate control signal,
   wherein the density histogram memory stores only the select sample sets output by the time mask gate for generating in the density histogram.

5. The real-time spectrum analyzer of claim 4, wherein the at least one trigger condition comprises an amplitude corresponding to each of the plurality of second samples in each sample set.

6. The real-time spectrum analyzer of claim 4, wherein the time mask detector is further configured to generate a time mask trigger signal when at least one sample of the plurality of second samples in any sample set meets the at least one trigger condition of the time domain mask.

7. The real-time spectrum analyzer of claim 6, wherein the processing unit further comprises:
   a time mask trigger configured to trigger a batch mode capture of the plurality of second samples in response to the time mask trigger signal generated by the time mask detector.

8. The real-time spectrum analyzer of claim 7, wherein the display unit is further configured to display a density histogram generated in response to the time mask trigger signal generated by the time mask detector.

9. The real-time spectrum analyzer of claim 4, wherein each of the time mask detector and the time mask gate are comprised of one or more field-programmable gate arrays (FPGAs).

10. The real-time spectrum analyzer of claim 1, wherein each of the plurality of first samples and the plurality of second samples comprises a continuous gap-free stream.

11. The real-time spectrum analyzer of claim 1, wherein the density histogram memory unit comprises a double buffered memory comprising first and second buffers, wherein one of the first and second buffers captures at least a portion of the plurality of second samples, while the other one of the first and second buffers transfers previously captured samples to a display processing unit for display on the display unit.

12. The real-time spectrum analyzer of claim 11, wherein the plurality of second samples are all routed to either the first buffer or the second buffer when the display unit is displaying a continuous gap-free stream of the plurality of second samples.

13. The real-time spectrum analyzer of claim 1, wherein a frequency reference for at least one of the second sample rate and the first sample rate is locked to an external frequency reference.

14. A method executed by a real-time spectrum analyzer for providing a density histogram of time domain data from an input signal in real-time, the method comprising:
   sampling the input signal at a first sample rate to provide a continuous gap-free stream of a plurality of first samples corresponding to the time domain data;
   resampling the plurality of first samples at a second sample rate, different from the first sample rate, to provide a continuous gap-free stream of a plurality of second samples corresponding to the time domain data grouped in sample sets;
   performing time mask detection and triggering on the plurality of second samples in a time domain, and outputting select sample sets of the plurality of second samples that meet at least one trigger condition;
   storing the select sample sets of the plurality of second samples for generating a continuous real-time gap-free density histogram corresponding to the time domain data; and
   displaying the generated continuous real-time gap-free density histogram,
   wherein the second sample rate is selected so that each sample set comprises an integer number of samples of the plurality of second samples per an integer number of periods at a frequency of interest of the input signal.

15. The method of claim 14, further comprising:
   performing fast Fourier transforms (FFTs) on the plurality of second samples to provide FFT spectra corresponding to the time domain data;
   identifying the frequency of interest of the input signal based on the FFT spectra; and
   adjusting the second sample rate based on the identified frequency of interest.

16. The method of claim 14, wherein performing time mask detection and triggering on the plurality of second samples in the time domain comprises:
   determining at a time mask detector whether each sample of the plurality of second samples meets the at least one trigger condition of a time domain mask, which contains the same number of mask values as the integer number of samples in each sample set, and generating a plurality of gate control signals corresponding to the plurality of second samples based on the determinations;
   receiving the plurality of gate control signals at a time mask gate; and
   outputting only the select sample sets of the plurality of second samples from the time mask gate that meet the at least one trigger condition in response to the corresponding gate control signals for storing.

17. The method of claim 16, further comprising:
   generating the a continuous real-time gap-free density histogram using only the select sample sets.

18. The method of claim 17, wherein displaying the continuous real-time gap-free density histogram comprises producing a blank display when no samples of the plurality of second samples meet the at least one trigger condition of the time domain mask.

19. The method of claim 16, wherein performing time mask detection and triggering on the plurality of second samples in the time domain further comprises:
   generating a time mask trigger signal when at least one sample of the plurality of second samples meets at least one trigger condition of a time domain mask.

20. The method of claim 19, further comprising:
   performing a batch mode capture of the plurality of second samples in response to the time mask trigger signal.

* * * * *